United States Patent
Sohn et al.

(10) Patent No.: US 9,305,631 B1
(45) Date of Patent: Apr. 5, 2016

(54) PROFILING METHOD OF ADDRESS ACCESS COUNT OF SEMICONDUCTOR DEVICE AND PROFILING CIRCUIT USING THE SAME

(71) Applicant: Samsung Electronics Co., Ltd., Suwon-si (KR)

(72) Inventors: Young Soo Sohn, Seoul (KR); Jong Pil Son, Seongnam-si (KR); Jae Sung Kim, Suwon-si (KR); Chul Woo Park, Yongin-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 184 days.

(21) Appl. No.: 14/107,669

(22) Filed: Dec. 16, 2013

Related U.S. Application Data

(60) Provisional application No. 61/740,706, filed on Dec. 21, 2012.

(51) Int. Cl.
  *G06F 12/10* (2006.01)
  *G11C 11/406* (2006.01)
  *G11C 11/402* (2006.01)

(52) U.S. Cl.
  CPC ...... *G11C 11/40607* (2013.01); *G06F 12/1018* (2013.01); *G11C 11/402* (2013.01)

(58) Field of Classification Search
  CPC .................................................... G11C 11/406
  USPC ........................................................ 711/106
  See application file for complete search history.

(56) References Cited

U.S. PATENT DOCUMENTS

| | | | |
|---|---|---|---|
| 5,644,545 | A | 7/1997 | Fisch |
| 5,777,921 | A | 7/1998 | Takata et al. |
| 7,193,874 | B1 | 3/2007 | Pereira et al. |
| 8,009,498 | B2 | 8/2011 | Chang et al. |
| 2003/0093616 | A1 | 5/2003 | Slavin |
| 2007/0033339 | A1 | 2/2007 | Best et al. |
| 2007/0070764 | A1 | 3/2007 | Miyamoto et al. |
| 2007/0183242 | A1 | 8/2007 | Miyamoto |
| 2008/0151669 | A1 | 6/2008 | Bill et al. |
| 2009/0190409 | A1 | 7/2009 | Dittrich et al. |
| 2011/0110175 | A1 | 5/2011 | Chang et al. |
| 2011/0122687 | A1 | 5/2011 | Kwon et al. |
| 2013/0097403 | A1* | 4/2013 | Zheng et al. ................... 711/206 |
| 2014/0095780 | A1* | 4/2014 | Bains et al. .................... 711/105 |

FOREIGN PATENT DOCUMENTS

| | | |
|---|---|---|
| KR | 10-2002-0038298 A | 5/2002 |
| KR | 10-2012-0081352 A | 7/2012 |
| WO | WO 2005/015568 A1 | 2/2005 |

* cited by examiner

*Primary Examiner* — Kevin Verbrugge
*Assistant Examiner* — Zubair Ahmed
(74) *Attorney, Agent, or Firm* — Muir Patent Law, PLLC

(57) ABSTRACT

Provided is a profiling unit and method for profiling a number of times that an input/output address of a semiconductor device is accessed. The profiling unit includes a hash unit configured to produce at least one hash value by perform a hash operation on the input/output address, and a profiling circuit configured to profile the number of times that the input/output address is accessed by using the at least one hash value.

18 Claims, 21 Drawing Sheets

PROFILING METHOD OF ADDRESS ACCESS COUNT OF SEMICONDUCTOR DEVICE AND PROFILING CIRCUIT USING THE SAME

CROSS-REFERENCE TO RELATED APPLICATIONS

A claim of priority under 35 U.S.C. §119 is made to U.S. Provisional Patent Application 61/740,706 filed on Dec. 21, 2012, the disclosure of which is hereby incorporated by reference in its entireties.

BACKGROUND

One or more aspects of the disclosed embodiments relate to a method of profiling a number of times that an address of a semiconductor is accessed and a profiling circuit using the same.

A dynamic random access memory (DRAM) is a memory device in which electric charges are stored in a capacitor included in each of a plurality of memory cells. Electric charges stored in the capacitor of each of the plurality of memory cells are lost due to leakage. Thus, the plurality of memory cells should be periodically refreshed to retain data stored therein.

When an address and a command are input to the DRAM, the DRAM is capable of accessing a memory cell corresponding to the address and performing an operation corresponding to the command on the memory cell. When a specific address is repeatedly input to the DRAM and a specific memory cell (hereinafter referred to as a 'concentrated memory cell') is thus accessed more frequently than other memory cells, dynamic noise increases in neighboring cells of the concentrated memory cell, thereby decreasing cell retention times of the neighboring cells. Thus, the neighboring cells should be more frequently refreshed to retain data stored therein. When an address of the concentrated memory cell (hereinafter referred to as a 'concentrated address') is detected, a frequency of refreshing the neighboring cells of the concentrated memory cell per unit time may be increased.

When the number of bits in each of addresses is i (i denotes a natural number), a concentrated address may be detected by profiling numbers of times that all the addresses are accessed by counting the numbers of times the addresses are input. However, this method is difficult to actually perform, since $2^i$ counters are needed.

SUMMARY

One or more aspects of the disclosed embodiments provide a method of profiling a number of times that an address of a semiconductor device is accessed by using a simpler circuit, and a profiling circuit using the same.

According to one embodiment, there is provided a method of profiling a number of times that an input/output address of a semiconductor device is accessed, the method including producing at least one hash value by performing a hash operation on the accessed input/output address; and profiling the number of times that the input/output address of the semiconductor device is accessed, based on the at least one hash value.

The profiling of the number of times that the input/output address of the semiconductor device is accessed may include determining whether the input/output address is stored in a storage unit, based on the at least one hash value; and increasing a number of access times stored in the storage unit corresponding to the input/output address when it is determined that the input/output address is stored in the storage unit.

The profiling of the number of times that the input/output address of the semiconductor device is accessed may further include determining whether the storage unit includes at least one empty entry corresponding to the at least one hash value when it is determined that the input/output address is not stored in the storage unit; storing the input/output address in one of the at least one empty entry when it is determined that the storage unit includes the at least one empty entry; storing the input/output address in one of the at least one entry corresponding to the at least one hash value when it is determined that the storage unit does not include the at least one empty entry; and updating the number of access times corresponding to the input/output address.

The profiling of the number of times that the input/output address of the semiconductor device is accessed may further include reducing a number of times that each of the at least one entry corresponding to the at least one hash value is to be accessed when it is determined that the input/output address is not stored in the storage unit.

The semiconductor device may be a dynamic random access memory (DRAM). The method may further include refreshing a memory cell corresponding to at least one address adjacent to the input/output address when the increased number of access times is equal to or greater than a preset threshold; and initializing the number of access times corresponding to the input/output address.

The number of access times corresponding to the input/output address may be initialized when all the least one adjacent address is auto-refreshed within a preset time period.

According to another aspect of the inventive concept, there is provided a profiling unit for profiling a number of times that an input/output address of a semiconductor device is accessed, the profiling unit including a hash unit configured to produce at least one hash value by performing a hash operation on the input/output address; and at least one profiling circuit configured to profile the number of times that the input/output address is accessed, based on the at least one hash value.

Each of the at least one profiling circuit may include a plurality of storage units each configured to store at least one storing address and a number of access times corresponding to the at least one storing address; a comparator configured to receive the at least one stored address corresponding to the at least one hash value from the plurality of storage units, and compare the input/output address with the at least one stored address; and a controller configured to update the plurality of storage units, based on a comparison result output from the comparator.

The at least one hash value may include a smaller number of bits than a number of bits of the input/output address, and the at least one hash value may be produced using different hash functions.

The hash unit may include at least one exclusive-OR (XOR) gate or at least one exclusive-NOR (XNOR) gate.

The controller may increase a number of access times corresponding to the input address when the input address is equal to one of the at least one storing address.

The controller may reduce a number of access time corresponding to the stored addresses when the input address is not equal to any one of the at least one storing address.

The controller may replace a stored address corresponding to a smallest number of access times among the at least one stored address with the input/output address when the input/output address is not equal to any one of the at least one stored addresses.

The controller may update a number of access times corresponding to the replaced input/output address.

The semiconductor device may be a dynamic random access memory (DRAM). The controller may receive a refresh address and an auto-refresh signal, and initialize a number of access times corresponding to a storage unit corresponding to the refresh address according to the auto-refresh signal.

In one embodiment, a method for a semiconductor memory address includes: receiving a first address for accessing a first memory cell of a memory cell array; performing a hash function on the received first address; determining a hash value based on the hash function; storing the first address at a first location determined based on the hash value; and storing a count of the number of access times for the first address.

The method may additionally include storing the first address at a first location within a first register based on the hash value; and storing the count of the number of access times for the first address in the first register.

The method may further include receiving the first address for accessing the first memory cell a second time; performing the hash function on the second received first address; determining the hash value based on the hash function; and based on the hash value, determining that the first address is already stored at the first location within the first register, and incrementing the count of the number of access times for the first address.

The method may additionally include receiving a second address for accessing a second memory cell of the memory cell array; performing the hash function on the second address; determining a hash value based on the hash function; and based on the hash value, determining that the first location in the first register is already occupied with an address different from the second address, and storing the second address at a second location within a second register.

In one embodiment, the first memory cell is included in a first row of the memory cell array, and the method further includes comparing the count to a predetermined threshold, and in response to the count exceeding the predetermined threshold, performing a refresh of a neighbor row of the first row.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION

Figure 1:
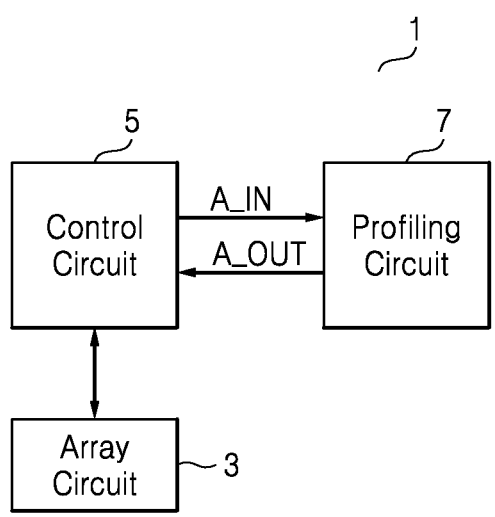
FIG. 1 is a schematic block diagram of a concentrated address control system according to one exemplary embodiment.

This disclosure now will be described more fully hereinafter with reference to the accompanying drawings, in which various exemplary embodiments are shown. This invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless the context indicates otherwise, these terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a schematic block diagram of a concentrated address control system 1 according to one exemplary embodiment. Referring to FIG. 1, the concentrated address control system 1 includes an array circuit 3, a control circuit 5, and a profiling circuit 7.

In certain embodiments, the array circuit 3 is a semiconductor circuit that includes a plurality of semiconductor devices, for example, arranged in an array. The term "semiconductor device," used herein may refer to an individual semiconductor element, such as a transistor or memory cell. However, its meaning is not limited as such. In certain embodiments, the array circuit 3 may be embodied as a volatile memory device or a nonvolatile memory device including an array of memory cells.

The volatile memory device may be embodied, for example, as a dynamic random access memory (DRAM), a static random access memory (SRAM), a thyristor RAM (T-RAM), a zero capacitor RAM (Z-RAM), or a twin transistor RAM (TTRAM).

The nonvolatile memory device may be embodied, for example, as an electrically erasable programmable read-only memory (EEPROM), a flash memory, a magnetic RAM (MRAM), a spin-transfer torque (STT)-MRAM, a conductive bridging RAM (CBRAM), a ferroelectric RAM (Fe-RAM), a phase change RAM (PRAM), a resistive RAM (RRAM), a nanotube RRAM, a polymer RAM (PoRAM), a nano floating gate memory (nFGm), a holographic memory, a molecular electronics memory device, or an insulator resistance change memory.

The control circuit 5 transmits an input address A_IN to the profiling circuit 7. The input address A_IN may be a signal indicating the location of a semiconductor device of the array circuit 3 that is accessed. For example, the input address A_IN may indicate the location of a memory cell in the array circuit 3.

The profiling circuit 7 may receive the input address A_IN, profile a number of times that the input address A_IN is accessed, detect at least one concentrated address A_OUT that is more frequently accessed than other input addresses based on a profiling result, and output the detected at least one concentrated address A_OUT to the control circuit 5. For example, when the number of times that the input address A_IN is accessed is greater than a preset threshold, the profiling circuit 7 may set and output the input address A_IN as the concentrated address A_OUT.

The control circuit 5 may control an operation of at least one device included in the array circuit 3 according to the concentrated address A_OUT. For example, the control circuit 5 may control an operation of a device of the array circuit 3 corresponding to at least one address adjacent to the concentrated address A_OUT.

Figure 2:
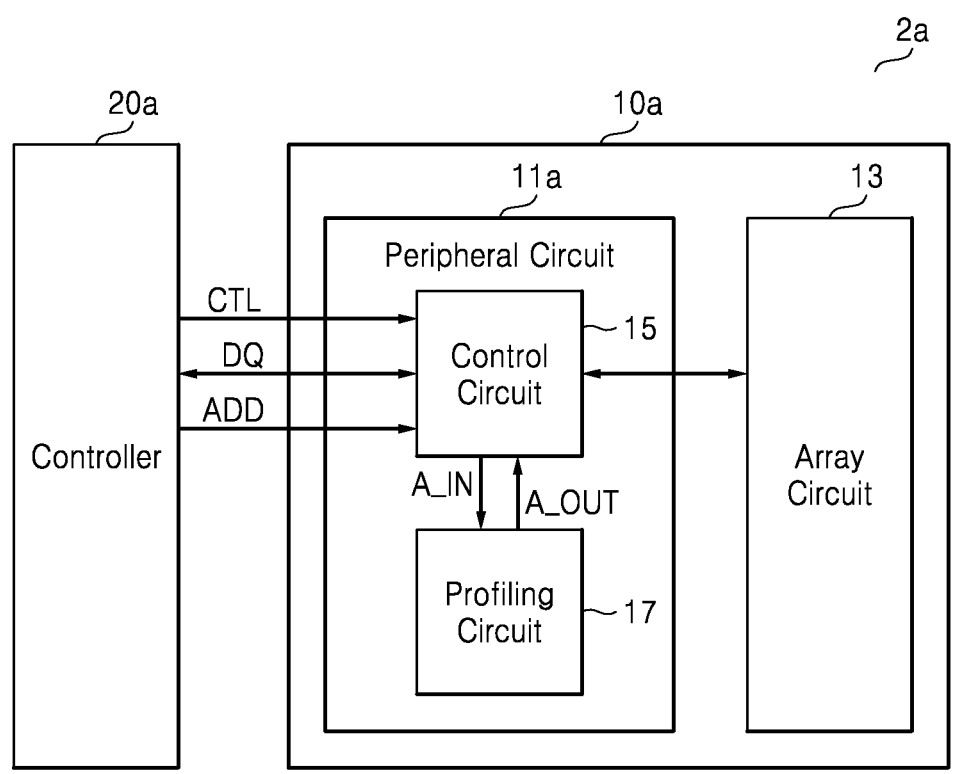
FIG. 2 is a block diagram of a memory system according to one exemplary embodiment.

FIG. 2 is a block diagram of a memory system 2a according to one exemplary embodiment.

Referring to FIG. 2, the memory system 2a includes a memory controller 20a and a memory device 10a. The memory system 2a refers to any of various systems that include a volatile memory or a nonvolatile memory.

The memory controller 20a generates a command signal CTL and an address signal ADD for controlling an operation of the memory device 10a, e.g., a write operation or a read operation. The address signal ADD may contain information regarding an input address A_IN.

In one embodiment, the memory controller 20a is connected to the memory device 10a via a bus. The memory controller 20a may output the command signal CTL and the address signal ADD to the memory device 10a and exchange input/output (I/O) data DQ with the memory device 10a via the bus.

The memory device 10a includes an array circuit 13 and a peripheral circuit 11a.

In one embodiment, the array circuit 13 includes a plurality of memory cells. For example, the array circuit 13 may include memory cells arranged in rows and columns.

The peripheral circuit 11a may access the array circuit 13 based on the command signal CTL and the address signal ADD received from the memory controller 20a.

In one embodiment, the peripheral circuit 11a includes a control circuit 15 and a profiling circuit 17.

The control circuit 15 extracts the input address A_IN from the address signal ADD. The input address A_IN may be, for example, a row address, a column address, or a combination of the row address and the column address. The control circuit 15 controls an operation of a memory cell of the array circuit 13 corresponding to the input address A_IN according to the command signal CTL.

In certain embodiments, the profiling circuit 17 receives the input address A_IN from the control circuit 15, profiles a number of times that the input address A_IN is accessed, detects at least one concentrated address A_OUT that is input more frequently than other addresses, and outputs the at least one concentrated address A_OUT to the control circuit 5.

The control circuit 15 may increase a frequency of refreshing memory cells adjacent to at least the memory cell corresponding to the at least one concentrated address A_OUT (hereinafter referred to as a 'concentrated memory cell') per unit time.

The memory controller 20a and the memory device 10a may be packaged in different packages or may be packaged together in one package. For example, the memory controller and memory device may be part of a packaged memory device including a first chip that functions as a memory controller chip and a second chip or plurality of chips that function as a memory storage. Alternatively, the memory controller may be in a separate package from the memory device. As such, a memory device, as used herein, may refer to a chip, a stack of chips, a package including one or more chips and a package substrate, or a package on package device.

Figure 3A:
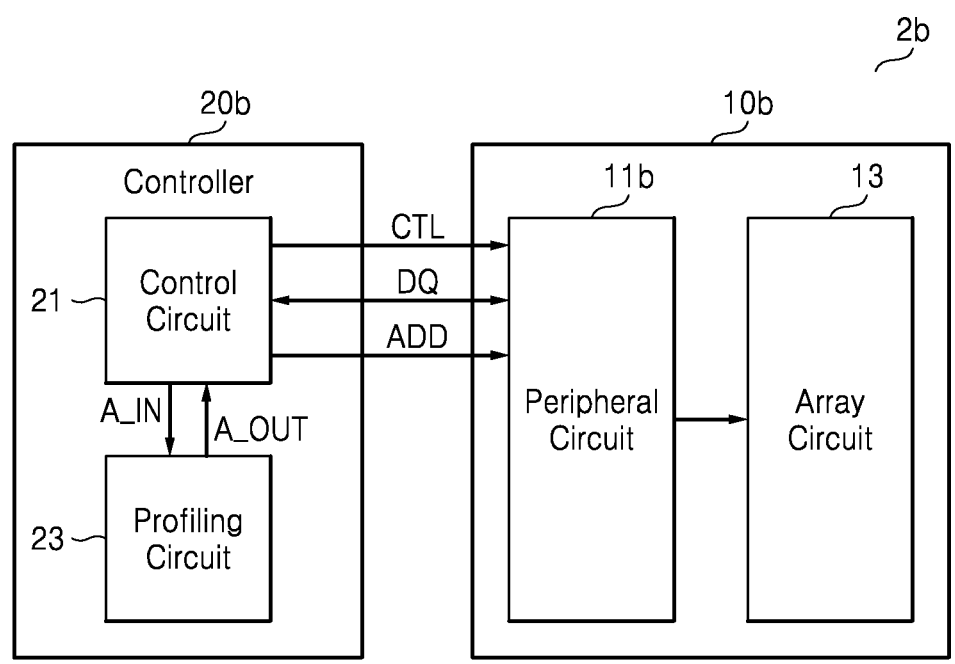
FIG. 3A is a block diagram of a memory system according to another exemplary embodiment.

FIG. 3A is a block diagram of a memory system 2b according to another exemplary embodiment. The memory system 2b of FIG. 3A is substantially the same as the memory system 2a illustrated in FIG. 2 and will be thus described focusing on the differences between the memory systems 2a and 2b below. Referring to FIG. 3A, a control circuit 21 and a profiling circuit 23 may be included in a memory controller 20b instead of a peripheral circuit 11b of a memory device 10b, compared to FIG. 2. Thus, generally speaking, the term "control circuitry" as used herein refers generally to the circuitry that functions to perform the control aspects of the various embodiments described herein, such as circuitry included in the controller 20a or 20b and/or control circuit 15 or 21. Also, in general, the term "circuitry" may be used herein to refer generally to any of the described circuits configured to perform certain functions, whether shown as part of a peripheral circuit, part of a controller, or part of another element.

The control circuit 21 transmits a command signal CTL and an address signal ADD to the memory device 10b, and exchanges I/O data DQ with the memory device 10b.

The address signal ADD may include information regarding an input address A_IN and a concentrated address A_OUT. The peripheral circuit 11b accesses an array circuit 13 based on the command signal CTL and the address signal ADD received from the memory controller 20b.

Figure 3B:
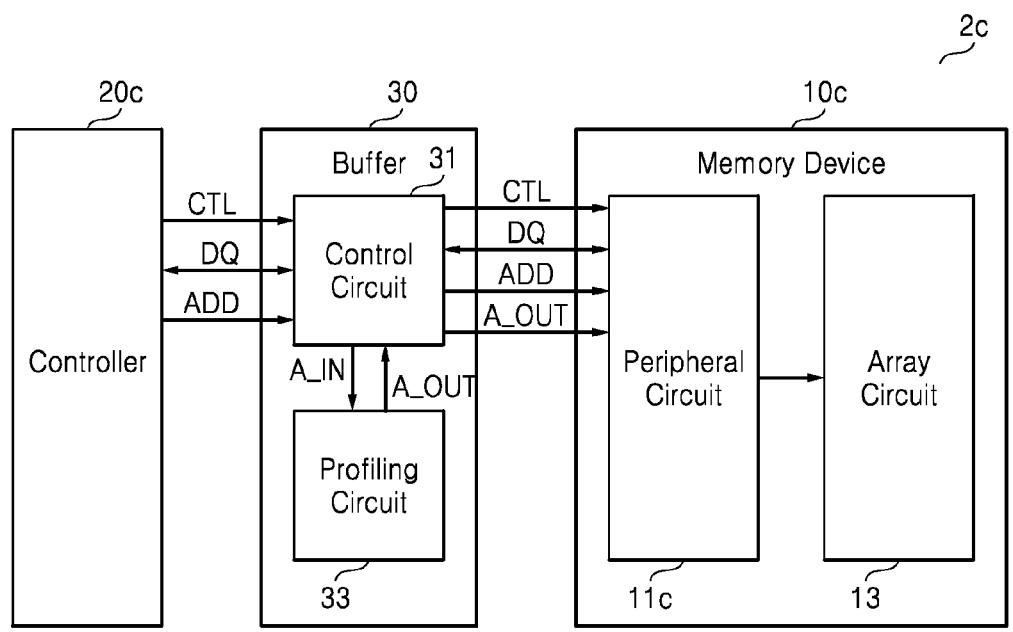
FIG. 3B is a block diagram of a memory system according to yet another exemplary embodiment.

FIG. 3B is a block diagram of a memory system 2c according to another exemplary embodiment. The memory system 2c of FIG. 3B is substantially the same as the memory system 2a illustrated in FIG. 2 and will be thus described focusing on the differences between the memory systems 2a and 2c below. Referring to FIG. 3B, the memory system 2c may include a memory controller 20c, a buffer 30, and a memory device 10c, compared to FIG. 2.

In one embodiment, the buffer 30 may be embodied as a registering clock driver (RCD) but embodiments of the inventive concept are not limited thereto.

A control circuit 31 and a profiling circuit 33 may be included in the buffer 30 instead of being included in a peripheral circuit 11c of the memory device 10c.

The control circuit 31 buffers a command signal CTL, an address signal ADD, and I/O data DQ. The control circuit 31 may extract an input address A_IN from the address signal ADD.

The profiling circuit 33 receives the input address A_IN from the control circuit 31, profiles a number of times that the input address A_IN is accessed, detects at least one concentrated address A_OUT that is input more frequently input than other addresses, and outputs the at least one concentrated address A_OUT to the control circuit 5.

The control circuit 31 may output the at least one concentrated address A_OUT or a signal related to the at least one concentrated address A_OUT to the memory device 10c.

The memory device 10c includes an array circuit 13 and the peripheral circuit 11c.

The peripheral circuit 11c may access the array circuit 13 according to the command signal CTL, the address signal ADD, and the concentrated address A_OUT that are output from the buffer 30.

The peripheral circuit 11c may increase a frequency of refreshing memory cells, which are adjacent to a concentrated memory cell included in the array circuit 13 corresponding to the at least one concentrated address A_OUT, per unit time.

Figure 4:
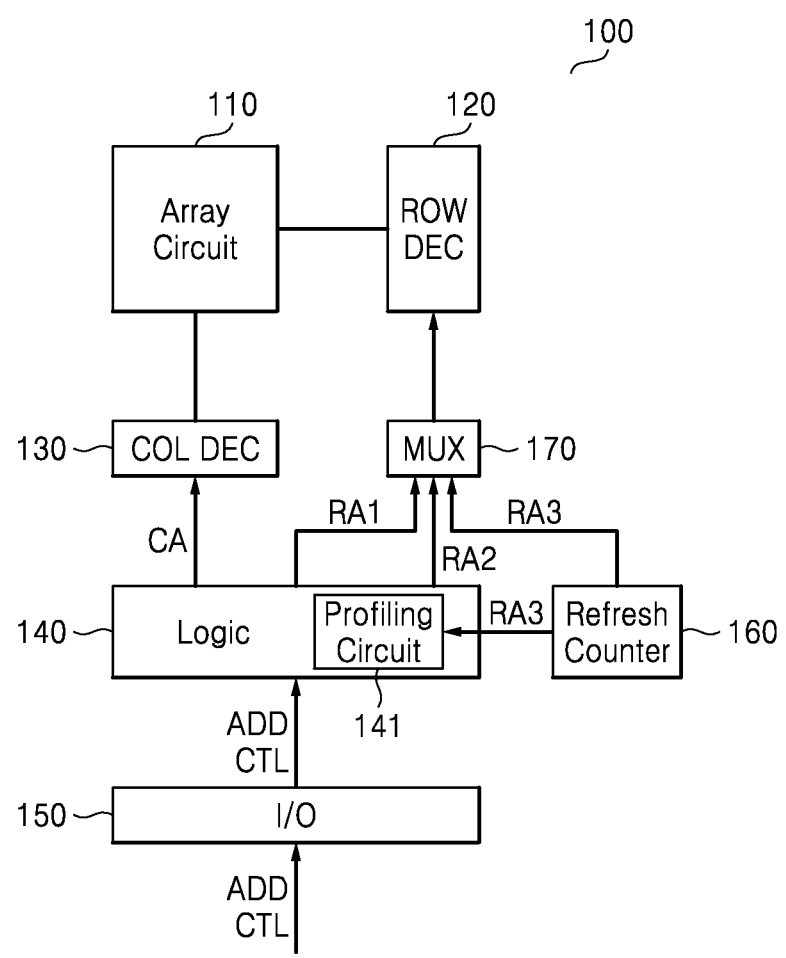
FIG. 4 is a block diagram illustrating an exemplary memory device such as shown in FIG. 2, according to one embodiment.

FIG. 4 is a block diagram of a memory device 100 such as that shown in the memory device 10a of FIG. 2 according to one exemplary embodiment.

Referring to FIG. 4, the memory device 100 may be a DRAM. The memory device 100 may include an array circuit 110, a row decoder 120, a column decoder 130, a logic circuit 140, an I/O circuit 150, a refresh counter 160, and a multiplexer 170.

The logic circuit 140 may include a profiling circuit 141.

In one embodiment, the structure of the memory device 100 corresponds to that of the control circuit 15 of the FIG. 2, except for the array circuit 110 and the profiling circuit 141. The profiling circuit 141 may correspond to the profiling circuit 17 of FIG. 2.

An operation of the memory device 100 during a read operation will be described below.

In one embodiment, the I/O circuit 150 receives an address signal ADD and a command signal CTL from the outside, and transmits them to the logic circuit 140.

The logic circuit 140 may extract a first row address RA1 and a column address CA from the address signal ADD. The logic circuit 140 may control a memory cell (not shown) of the array circuit 110 corresponding to the first row address RA1 and the column address CA to perform an operation corresponding to the command signal CTL by transmitting the first row address RA1 to the row decoder 120 via the multiplexer 170 and transmitting the column address CA to the column decoder 130.

The profiling circuit 141 may receive the first row address RA1, profile a number of times that the first row address RA1 is accessed, and detect a concentrated address (not shown) that is input more frequently than other addresses, based on a profiling result.

The logic circuit 140 may output at least one second row address RA2 adjacent to the concentrated address detected by the profiling circuit 141 to the multiplexer 170. The row adjacent to the row having a concentrated address may be referred to herein as a concentrated address neighbor or a concentrated address neighbor row.

The refresh counter 160 is configured to auto-refresh the memory device 100, and may output a third row address RA3 to the multiplexer 170. The third row address RA3 may be a signal obtained by sequentially outputting row addresses of the array circuit 110.

The multiplexer 170 may selectively output the first row address RA1, the second row address RA2, and the third row address RA3 to the row decoder 120.

The row decoder 120 may select and refresh cells included in the rows having the first row address RA1, the second row address RA2, or the third row address RA3 according to an output of the multiplexer 170.

When the first row address RA1 which is a specific address is concentratedly input from the outside, a cell retention time of cells included in a row having a second row address RA2 adjacent to the first row address RA1 may decrease.

According to one embodiment, the stability and reliability of the DRAM may be improved by additionally refreshing the cells in the row having the second row address RA2 (e.g., the concentrated address neighbor row).

Figure 5:
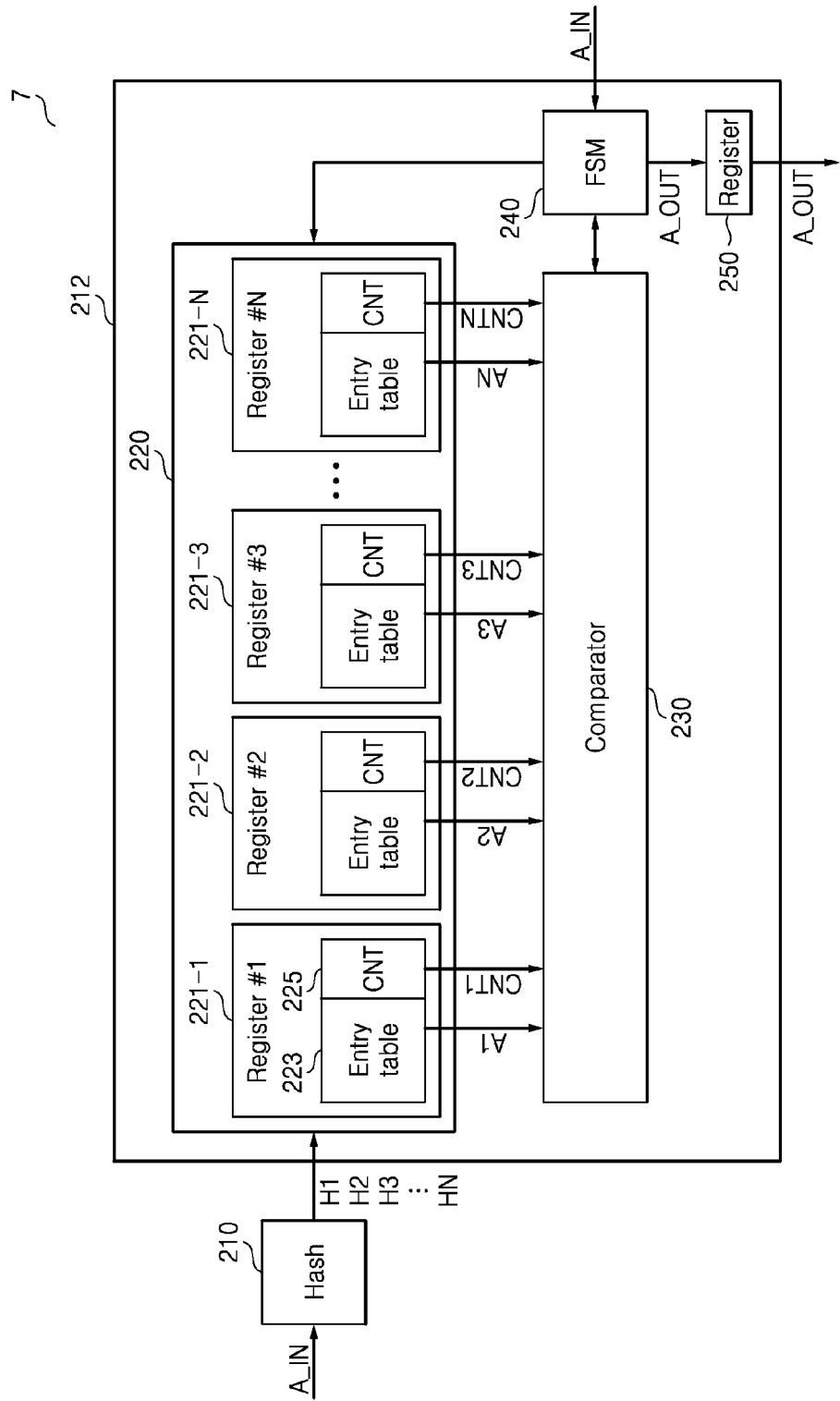
FIG. 5 is a detailed block diagram of a profiling circuit of FIG. 1, according to one exemplary embodiment.
Figure 6:
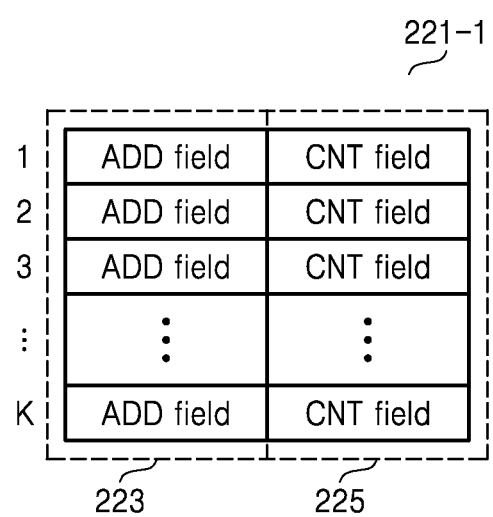
FIG. 6 is a detailed diagram of a storage unit of FIG. 5, according to one exemplary embodiment.

FIG. 5 is a detailed block diagram of the profiling circuit 7 such as that shown in FIG. 1, according to one exemplary embodiment. FIG. 6 is a detailed diagram illustrating a storage unit 221-1 of FIG. 5, according to one exemplary embodiment. Referring to FIG. 5, the profiling circuit 7 includes a hash unit 210 and a profiling unit 212.

The hash unit 210 performs a hash operation on an input address A_IN and generates at least one hash value (e.g., hash values H1 to HN). The at least one hash value (e.g., the hash values H1 to HN) may be a value having a smaller number of bits than the number of bits of the input address A_IN. In one embodiment, the hash values H1 to HN may be each an M-bit value. Here, 'M' denotes an integer that is equal to or greater than '1'. In another embodiment, the hash values H1 to HN may have different numbers of bits.

The hash unit 210 may include at least one arithmetic gate, e.g., an exclusive-OR (XOR) gate or a plurality of exclusive-NOR (XNOR) gates.

For example, if the input address A_IN is a 16-bit address having a first bit A[1] to a sixteenth A[16] and four 4-bit hash values H1 to HN are produced by performing the hash operation on the input address A_IN, then the first hash value H1 may be produced by Equation 1 below.

$$H1[1]=A[1]\char`\^A[5]\char`\^A[10]\char`\^A[12]\char`\^A[13]$$

$$H1[2]=A[2]\char`\^A[6]\char`\^A[11]\char`\^A[13]\char`\^A[14]$$

$$H1[3]=A[1]\char`\^A[3]\char`\^A[5]\char`\^A[7]\char`\^A[9]\char`\^A[13]\char`\^A[14]\char`\^A[15]$$

$$H1[4]=A[1]\char`\^A[2]\char`\^A[4]\char`\^A[5]\char`\^A[6]\char`\^A[8]\char`\^A[10]\char`\^A[11]\char`\^A[12]\char`\^A[13]\char`\^A[14]\char`\^A[15]\char`\^A[16]$$ [Equation 1]

In Equation 1, 'H1[1]' to 'H1[4]' denote bits of the first hash value H1, respectively.

The second hash value H2 to the $N^{th}$ hash value HN may be produced using hash functions that are different from that in Equation 1. In another embodiment, the first hash value H1 to the $N^{th}$ hash value HN may be produced using the same hash function.

However, the inventive concept is not limited thereto and the hash unit 210 may be embodied in other various ways.

In one embodiment, the hash unit 210 may produce the hash values H1 to HN using all the bits of or some bits of the input address A_IN.

For example, the hash unit 210 may set a first bit A[1] to a third bit A[3] to the first hash value H1, and a fifth bit A[5] to an eighth bit A[8] to the second hash value H2. In another example, where the address includes a number of bits (e.g., 16 bits), a first hash function HF1 may be used for a first set of bits (e.g., the most significant 4 bits), a second hash function HF2 may be used for a second set of bits (e.g., the next 4 bits), a third hash function HF3 may be used for a third set of bits (e.g., the next 4 bits), and a fourth hash function HF4 may be used for a fourth set of bits (e.g., the last significant 4 bits).

The profiling unit 212 profiles a number of times CNT that the input address A_IN is accessed, based on the hash values H1 to HN.

The profiling unit 212 may include at least one storage unit 220, a comparator 230, a controller 240, and a register 250.

Although it is hereinafter assumed that the number of the hash values H1 to HN and the number of storage units 221 (also referred to herein as storage tables or storage registers) of the at least one storage unit 220 are each 'N', an embodiment of the inventive concept is not limited thereto. Here, 'N' denotes an integer that is equal to or greater than '2'.

In another embodiment, the number of the hash values H1 to HN and the number of storage units 221 of the at least one storage unit 220 may be each '1'. In another embodiment, the number of the hash values H1 to HN and the number of storage units 221 of the at least one storage unit 220 may be different from each other.

Each storage unit 221 of the at least one storage unit 220 may include an entry table including an address field 223 and a count field 225. In one embodiment, each storage unit 221 of the at least one storage unit 220 is embodied as an SRAM, but an embodiment of the inventive concept is not limited thereto.

The address field 223 may include, for example, K entries. One input address A_IN may be stored as storing addresses A1 to AN (also referred to as stored addresses) in each of the K entries. Here, 'K' denotes an integer that is equal to greater than '2'.

The count field 225 may include K entries. In each of the entries of the count field 225, a number of times CNT of accessing the input address A_IN stored in the address field of the entry table 223 corresponding thereto is stored. Here, 'K' denotes an integer that is equal to greater than '2'.

An $M^{th}$ storage unit 221-M may receive an $M^{th}$ hash value HM. Here, 'M' denotes an integer that is equal to or greater than '1' and less than or equal to 'N'. The $M^{th}$ storage unit 221-M may transmit an $M^{th}$ storing address AM and an $M^{th}$ number of times CNTM of accessing the input address A_IN, which correspond to the $M^{th}$ hash value HM, to the comparator 230.

For example, in one embodiment, the first storage unit 221-1 receives the first hash value H1. The first storage unit 221-1 may set an address stored in an (H1)' entry to the first storing address A1, and set a number of access times stored in the (H1)$^{th}$ entry to a first number of access times CNT1. The first storage unit 221-1 may transmit the first storing address A1 and the first number of access times CNT1 to the comparator 230.

The comparator 230 may receive the input address A_IN from the outside, the hash unit 210, or the controller 240. The comparator 230 may compare each of the first storing address A1 to the $N^{th}$ storing address AN with the input address A_IN, and output a comparison result to the controller 240.

For example, when the input address A_IN is equal to one of the first storing address A1 to the $N^{th}$ storing address AN, i.e., when the storage unit 220 stores the input address A_IN, the comparator 230 may output the input address A_IN and the number of access times CNT corresponding to the input address A_IN to the controller 240.

When the input address A_IN is not equal to any one of the first storing address A1 to the $N^{th}$ storing address AN, the comparator 230 may output a signal (not shown) indicating that the input address A_IN is not stored in the storage unit 220 to the controller 240.

The controller 240 may update the at least one storage unit 220 based on a comparison result output from the comparator 230. In one embodiment, the controller 240 may be embodied as a finite state machine (FSM). For example, when the input address A_IN is equal to one of the first storing address A1 to the $N^{th}$ storing address AN, and the comparator 230 outputs the input address A_IN and the number of access times CNT corresponding to the input address A_IN to the controller 240, the controller 240 may update one of the storage units 221 corresponding to the input address A_IN to update (e.g., increment) the count value associated with that address.

When the number of access times CNT output from the comparator 230 is equal to or greater than a preset threshold, the controller 240 may set a storing address corresponding to the number of access times CNT to a concentrated address A_OUT, and output the concentrated address A_OUT to the register 250. The preset threshold may be, for example, a predetermined value stored beforehand in a mode register.

For convenience of explanation, an operation of the controller 240 will be described in greater detail with reference to FIGS. 8 to 11 below.

The register 250 may store the concentrated address A_OUT and output it to the outside. In one embodiment, the register 250 may also store at least one address adjacent to the concentrated address A_OUT (e.g., a concentrated address neighbor) and may output the at least one address to the outside.

Figure 7A:
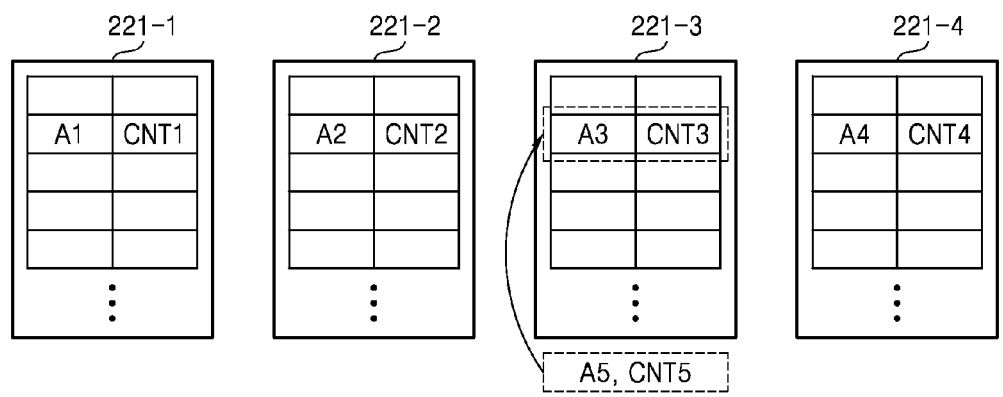
FIGS. 7A and 7B illustrate operations of at least one storage unit of FIG. 5 according to certain exemplary embodiments.
Figure 7B:
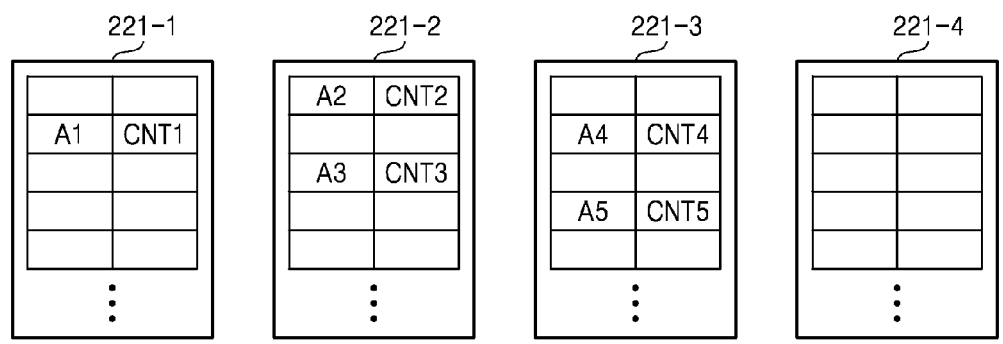

FIGS. 7A and 7B illustrate operations of the at least one storage unit 220 of FIG. 5 according to exemplary embodiments. Specifically, FIG. 7A illustrates a case in which hash values H1 to HN are the same for five input addresses A1, A2, A3, A4, and A5. FIG. 7B illustrates a case in which hash values H1 to HN are different for the five input addresses A1, A2, A3, A4, and A5.

Referring to FIGS. 5 and 7A, the five input addresses A1, A2, A3, A4, and A5 may be concentratedly input to a semiconductor device. In this case, when the hash unit 210 produces hash values H1 to HN using only one hash function, depending on the hash function used, the hash values H1 to HN may be the same for the five input addresses A1, A2, A3, A4, and A5.

For example, if the five input addresses A1, A2, A3, A4, and A5 have the same first to tenth bits A[1] to A[10] and the hash unit 210 produces the hash values H1 to HN according to a hash function using the first to tenth bits A[1] to A[10], then all the hash values H1 to HN are the same. As such, a hash function can be used that increases the likelihood that all addresses input have the same hash value.

As one particular example, it is assumed that the hash values H1 to HN are each '2', a first input address A1 to a fifth input address A5 are sequentially input, and the number of tables in the at least one storage unit 220 is '4'.

When the first input address A1 is input to the profiling circuit 7, the controller 240 checks a second entry of the first storage unit 221-1 corresponding to a first hash value H1 since the first hash value H1 is '2'. Since the second entry of the first storage unit 221-1 is empty, the controller 240 stores the first input address A1 and a first number of access times CNT1 corresponding to the first input address A1 in the second entry of the first storage unit 221-1. The first number of access times CNT1 may be '1' or a different preset value. Then, the controller 240 may increase the first number of access times CNT1 whenever the first input address A1 is input to the profiling circuit 7.

When the second input address A2 is input to the profiling circuit 7, the controller 240 checks the second entry of the first storage unit 221-1 corresponding to the first hash value H1. Since the first input address A1 is stored in the second entry of the first storage unit 221-1, the controller 240 checks a second entry of the second storage unit 221-2 corresponding to a second hash value H2. Since the second entry of the second storage unit 221-2 is empty, the controller 240 stores the second input address A2 and a second number of access times CNT2 corresponding to the second input address A2 in the second entry of the second storage unit 221-2. The second number of access times CNT2 may be '1' or a different present value. Thereafter, the controller 240 may increase the second number of access times CNT2 whenever the second input address A2 is input to the profiling circuit 7.

Similarly, the third input address A3 and the fourth input address A4 may be stored in the third storage unit 221-3 and the fourth storage unit 221-4, respectively.

When the fifth input address A5 is input to the profiling circuit 7, the controller 240 checks whether all the second entries of the respective first to fourth storage units 221-1 to 221-4 are occupied. The controller 240 detects the third input address A3 having a smallest number of access times (e.g., a number of access times CNT3) among the numbers of access times stored in the second entries of the respective first to fourth storage units 221-1 to 221-4, based on a number of access times output to the comparator 230. The controller 240 may replace the third input address A3 stored in the second entry of the third storage unit 221-3 with the fifth input address A5 and initialize a number of access times CNT5 of the fifth input address A5.

According to the embodiment described above, when the fifth input address A5 is input, the third input address A3 is deleted from the storage unit 220 and at least four concentrated addresses may be thus profiled.

Stated differently, the storage unit 220 may operate as follows. For each received address, a hash function is performed on the address, and the memory system attempts to store the address in the first table in the location indicated by a hash value resulting from the hash function. If the location is occupied in the first table with the same address, the system increments the number of access times (also referred to as a counter or count value). If the location is occupied in the first table with a different address, the memory system tries to store the address in the second table. It then repeats the process until it finds a location to store the address or increment a count value. If that location in all of the tables is occupied with a different address than the incoming address, then the memory system determines which count value is smallest, and replaces that address with the new address and resets the count value (e.g., to 1).

Referring to FIG. 7B, the hash unit 210 may produce the hash values H1 to HN using N different hash functions.

Using the example from above, where there are 16 bits in the address, and there are four different hash functions (HF1-HF4) for each input address, resulting in four hash values for each input address, all four hash functions (or fewer in some cases) can be used to determine where to store an input address.

For example, in the example of FIG. 7B, it is assumed that four hash functions HF1 to HF4 may be used, one hash function corresponding to a respective table 221-1 through 221-4. The first hash function HF1 may be applied to the most significant 4 bits of the address, the second hash function HF2 may be applied to the next significant 4 bits of the address, and the third hash function HF3 may be applied to the next 4 bits of the address, and the fourth hash function HF4 may be applied to the lease significant 4 bits of the address.

Exemplary addresses may be input that result in the following. For addresses A1 to A5, the first hash value H1 using the first hash function HF1 may be '2' for all the first to fifth input addresses A1 to A5. For address A2-A5, the second hash value H2 using the second hash function HF2 may be '1' for address A2, and '3' for addresses A3-A5. For addresses A4-A5, the third hash value H3 using the third hash function HF3 may be '2' for address A4 and '4' for address A5. The fourth hash function HF4 is not used in this example.

In this case, when the first input address is A1, the hash value H1 of '2' is determined, and the memory system performs the steps described above in connection with FIG. 7A for that hash value and address. For example, it determines if the second entry of the first table 221-1 is available, and because it is, the first input address A1 is stored in the second entry of the first storage unit 221-1, and a number of access times CNT1 is initiated.

Next, for the second address A2, a hash value H1 (using the first hash function HF1) is determined to be '2,' and a hash value H2 (using the second hash function HF2) is determined to be '1.' Because the hash function HF1 is associated with the first storage unit 221-1, the memory system checks if the second entry of the first storage unit 221-1 (corresponding to a hash value H1 of '2') is occupied. Because it is (and with a different address from A2), then the memory system next checks if the first entry of the second storage unit 221-2 (corresponding to a hash value H2 of '1') is occupied. This entry is vacant, so the second input address A2 is stored in a first entry of the second storage unit 221-2, and a number of access times CNT1 is initiated.

Next, for the third address A3, a hash value H1 (using the first hash function HF1) is determined to be '2,' and a hash value H2 (using the second hash function HF2) is determined to be '3.' Because the hash function HF1 is associated with the first storage unit 221-1, the memory system checks if the second entry of the first storage unit 221-1 (corresponding to a hash value H1 of '2') is occupied. Because it is (and with a different address from A3), then the memory system next checks if the third entry of the second storage unit 221-2 (corresponding to a hash value H2 of '3') is occupied. This entry is vacant, so the third input address A3 is stored in a third entry of the second storage unit 221-2.

Following a similar procedure, because the third hash value H3 for the fourth input address A4 is '2' and the third hash value H3 for the fifth input address A5 is '4', the fourth input address A4 is stored in a second entry of the third storage unit 221-3 and the fifth input address A5 is stored in a fourth entry of the third storage unit 221-3.

Though not shown, in the example of FIG. 7B, if a subsequent address is input that is again the address A2, again a hash value H1 (using the first hash function HF1) is determined to be '2,' and a hash value H2 (using the second hash function HF2) is determined to be '1.' Because the hash function HF1 is associated with the first storage unit 221-1, the memory system checks if the second entry of the first storage unit 221-1 (corresponding to a hash value H1 of '2') is occupied. Because it is (and with a different address from A2), then the memory system next checks if the first entry of the second storage unit 221-2 (corresponding to a hash value H2 of '1') is occupied. This entry is occupied, so the memory system checks if it is occupied with the same address as the input address A2. Because it is, and A2 is already stored in this entry, a number of access times CNT1 can be incremented.

Thus, the input addresses A1 to A5 may be more randomly distributed in the storage units 221-1 to 221-4 using different N hash functions, thereby increasing the number of concentrated addresses to be profiled.

Figure 8:
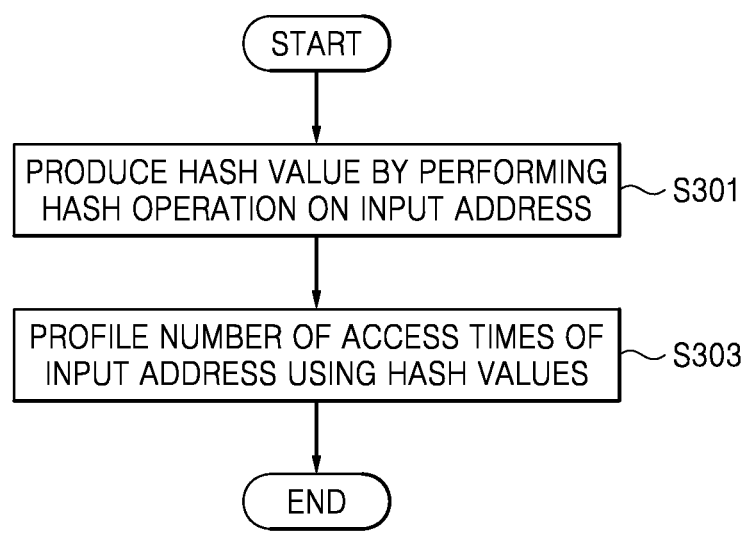
FIG. 8 is a flowchart illustrating an exemplary method of profiling a number of times that an address of a semiconductor device is accessed according to one embodiment.

FIG. 8 is a flowchart illustrating a method of profiling a number of times that an address of a semiconductor device is accessed according to one exemplary embodiment.

Referring to FIGS. 5 and 8, the hash unit 210 produces at least one hash value, e.g., hash values H1 to HN, by performing a hash operation on an input address A_IN to be accessed (operation S301).

Then, the profiling unit 212 profiles a number of access times CNT of the input address A_IN using the hash values H1 to HN (operation S303).

Figure 9:
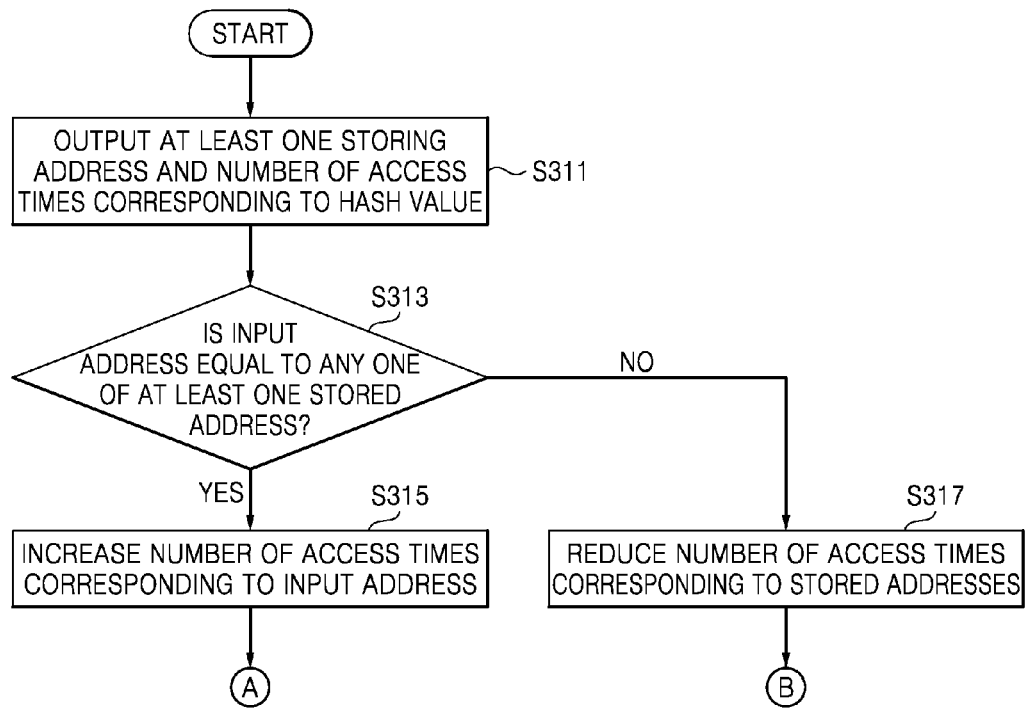
FIGS. 9 and 10 are detailed flowcharts illustrating an exemplary profiling process included in the method FIG. 8, according to one embodiment.
Figure 10:
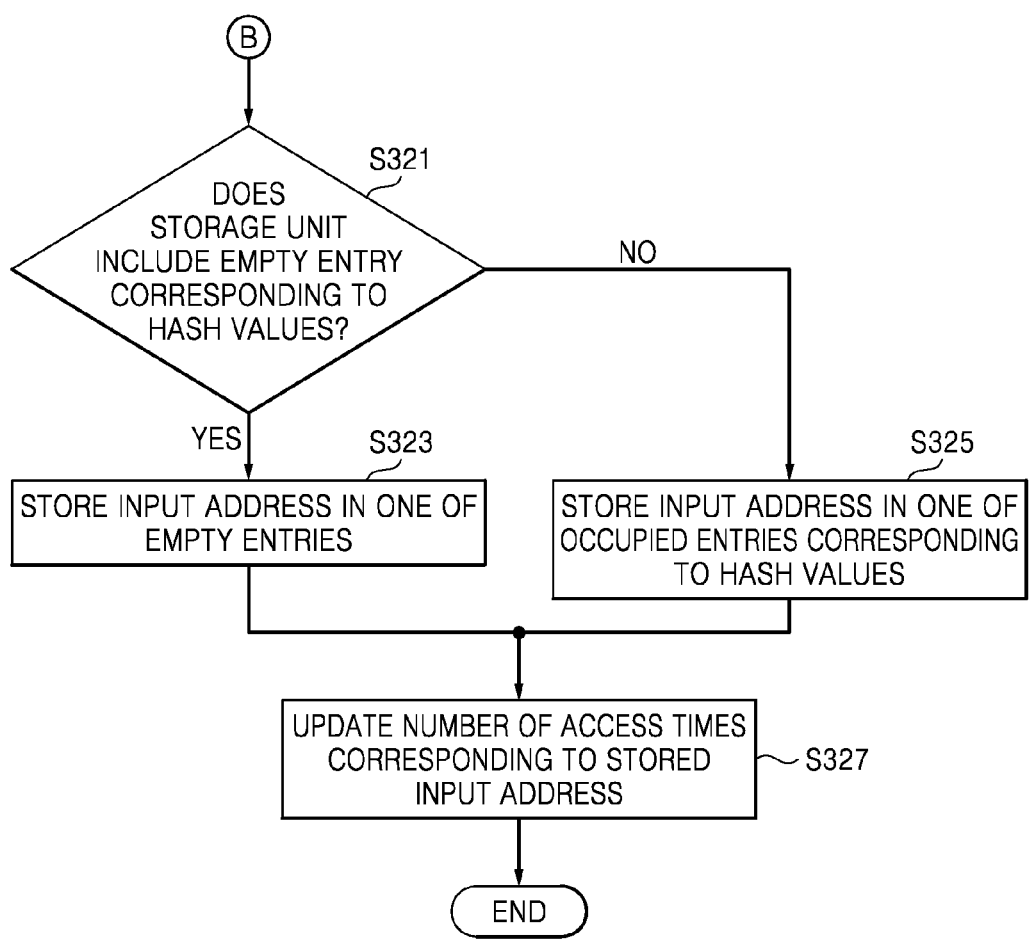

FIGS. 9 and 10 are detailed flowcharts illustrating an exemplary process of profiling of the number of access times CNT of the input address A_IN (operation S303 in FIG. 8).

Referring to FIGS. 5 and 9, the at least one storage unit 220 outputs stored addresses A1 to AN and numbers of access times CNT1 to CNTN corresponding to hash values H1 to HN (operation S311).

For example, an $M^{th}$ storage unit 221-M may receive an $M^{th}$ hash value HM and transmit an $M^{th}$ stored address AM and an $M^{th}$ number of access times CNTM corresponding to the $M^{th}$ hash value HM to the comparator 230. Here, 'M" denotes an integer that is equal to or greater than '1' and less than or equal to 'N'.

The comparator 230 may receive an input address A_IN from the controller 240. Then, the comparator 230 determines whether the input address A_IN is equal to one of the stored addresses A1 to AN output from the at least one storage unit 220 (operation S313).

When the input address A_IN is equal to one of the stored addresses A1 to AN, the controller 240 increases a number of access times CNT that corresponds to the input address A_IN and that is stored in the at least one storage unit 220 (operation S315).

In one embodiment, when the input address A_IN is not equal to any one of the stored addresses A1 to AN, the controller 240 may reduce the number of access times CNT corresponding to each of the stored addresses A1 to AN (operation S317). However, an embodiment of the inventive concept is not limited thereto and the controller 240 may perform a subsequent operation without performing operation S317.

Referring to FIG. 10, when the input address A_IN is not equal to any one of the stored addresses A1 to AN, the controller 240 determines whether the at least one storage unit 220 includes any empty entry corresponding to the hash values H1 to HN (operation S321).

In one embodiment, the controller 240 may determine whether empty entries corresponding to the hash values H1 to HN for that address are present in the order of the first storage unit 221-1 to the $N^{th}$ storage unit 221-N.

When the at least one storage unit 220 includes any empty entry at a corresponding hash value for the address A_IN, the controller 240 stores the input address A_IN in one of the empty entries (operation S323).

When the at least one storage unit 220 does not include empty entries, the controller 240 stores the input address A_IN in one of the occupied entries corresponding to the hash values H1 to HN (operation S325).

For example, the comparator 230 may detect a minimum value among numbers of access times CNT output from the at least one storage unit 220. The controller 240 may replace storing addresses A1 to AN corresponding to the minimum value among numbers of access times CNT with the input address A_IN.

However, the scope of the inventive concept is not limited to the embodiment regarding replacement of the minimum value, and embodiments of the inventive concept may be expanded within a modification range which will be apparent to those of ordinary skill in this art. For example, the at least one storage unit 220 may further store information regarding time when each of the storing address A1 to AN is input, and the controller 240 may replace stored addresses A1 to AN that were most previously input (e.g., least recently input addresses) with the input address A_IN.

The controller 240 may update a number of access times CNT corresponding to the stored input address A_IN of the at least one storage unit 220 (operation S327). For example, the controller 240 may set the number of access times CNT to '1' or a different preset value.

Figure 11:
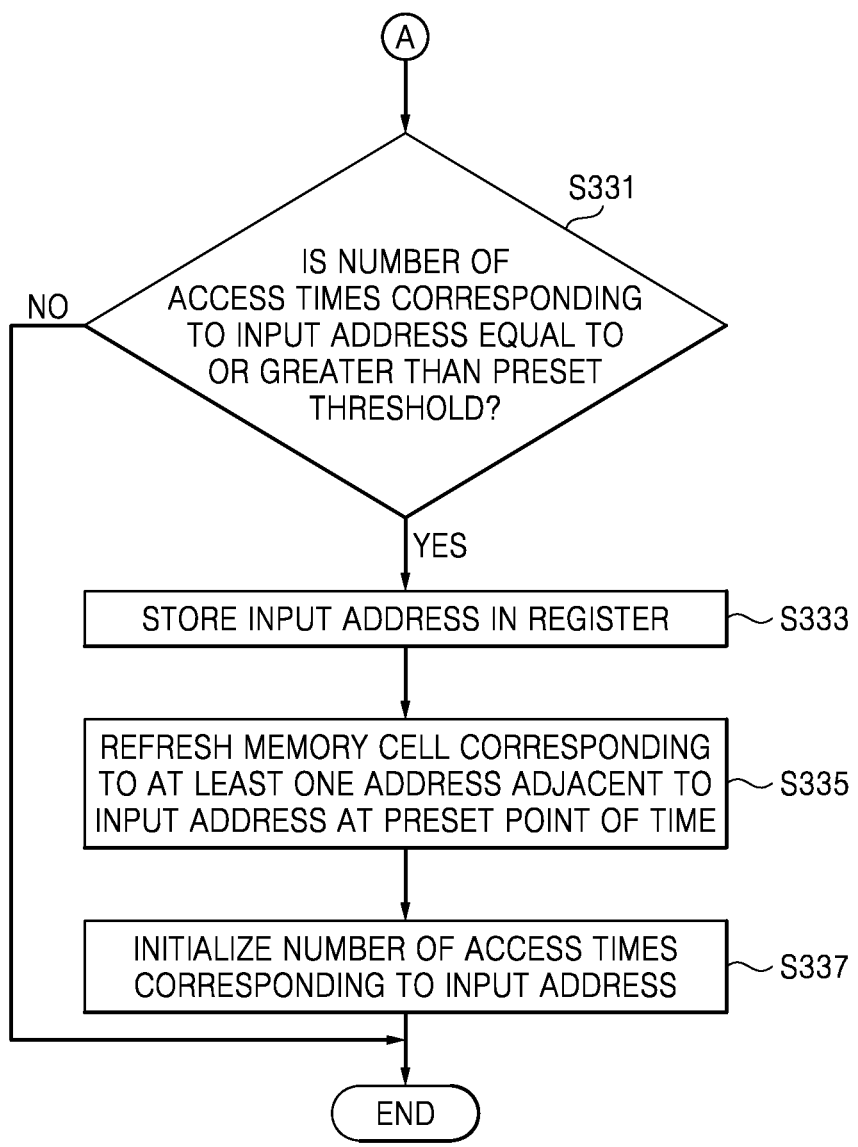
FIG. 11 is a flowchart illustrating a method of refreshing a memory cell adjacent to a concentrated memory cell after the profiling process included in the method of FIG. 8 is performed, according to one exemplary embodiment.

FIG. 11 is a flowchart illustrating a method of refreshing a memory cell adjacent to a concentrated memory cell after the profiling process included in the method of FIG. 8 is performed, according to one exemplary embodiment.

Referring to FIGS. 1, 5, and 11, a case in which the array circuit 3 is a DRAM will now be described. The controller 240 determines whether a number of access times CNT corresponding to an input address A_IN is equal to or greater than a preset threshold (operation S331).

When it is determined that the number of access times CNT is equal to or greater than the preset threshold, the controller 240 stores the input address A_IN in the register 250 (operation S333).

The register 250 may output the input address A_IN to the array circuit 3 at a preset point of time, e.g., at a CAS before a RAS refresh (CBR) phase of the DRAM.

Then, the array circuit 3 may refresh a memory cell corresponding to at least one address adjacent to the input address A_IN (operation S335). For example, the array circuit 3 may refresh neighboring row of the row that includes the input address A_IN (e.g., a concentrated address neighbor row).

Then, the controller 240 may initialize the number of access times CNT of the at least one storage unit 220 that corresponds to the input address A_IN (operation S337). For example, the controller 240 may set the number of access times CNT to '0' or another preset value (e.g., it may reset the count value CNT for that address).

Figure 12:
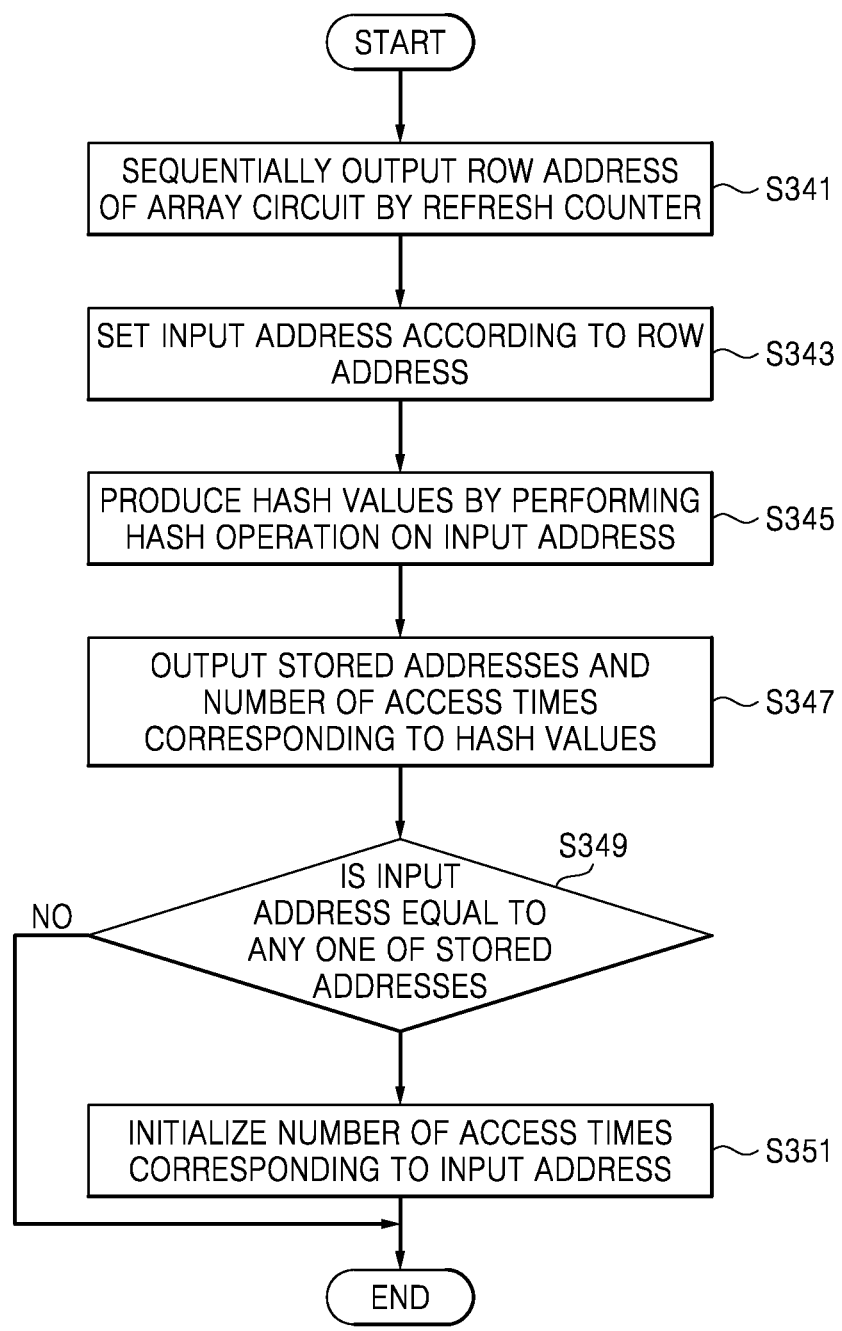
FIG. 12 is a flowchart illustrating a method of updating a number of access times during an auto refresh operation of a dynamic random access memory (DRAM) according to one exemplary embodiment.

FIG. 12 is a flowchart of a method of updating a number of access times during an auto refresh operation of a DRAM according to one exemplary embodiment.

Referring to FIGS. 4, 5, and 12, the refresh counter 160 may sequentially output row address A3 of the array circuit 110 to the multiplexer 170 and the profiling circuit 141 (operation S341).

In this case, an input address A_IN of the profiling circuit 141 may be set according to the row address A3 (operation S343). In one embodiment, the input address A_IN may be an address adjacent to the row address A3, and all addresses adjacent to the input address A_IN may be auto-refreshed within a preset time period.

Then, the hash unit 210 may perform a hash operation on the input address A_IN to produce at least one hash value, e.g., hash values H1 to HN (operation S345).

Then, the at least one storage unit 220 outputs stored addresses A1 to AN and a number of access times CNT corresponding to the hash values H1 to HN (operation S347).

The comparator 230 may receive the input address A_IN from the controller 240. The comparator 230 determines whether the input address A_IN is equal to one of the stored addresses A1 to AN output from the at least one storage unit 220 (operation S349). In another embodiment, another method is used instead of using operation S345 and S347 to determine whether the input address A_IN is equal to one of the stored addresses A1 to AN.

When the input address A_IN is equal to one of the stored addresses A1 to AN, the controller 240 may initialize the number of access times CNT stored in the at least one storage unit 220 corresponding to the input address A_IN (operation S351). For example, the controller 240 may set the number of access times CNT to '0' or another preset value.

As one example, it is assumed that the array circuit 3 includes a first row, a second row, and a third row, the first to third rows are sequentially refreshed, and the second row is concentratedly accessed. Dynamic noise from the second row may influence data corresponding to the first row and the third row, and may cause data errors.

When the refresh counter 160 outputs a row address A3 corresponding to the third row, the third row may be refreshed, and a time period that is far shorter than a cell retention time may pass after the first row is refreshed. In this case, even if the second row is concentratedly accessed, data corresponding to the first row and the third row are not changed by dynamic noise from the second row, since the first row and the third row are refreshed a little while previously, and the profiling circuit 141 may thus set a number of access times corresponding to the second row to '0'.

Thus, since a number of access times CNT of one input address A_IN stored in the at least one storage unit 220 may be initialized within one auto refresh cycle, a range of values that the number of access times CNT may have is limited. Thus, the size of the at least one storage unit 220 may be minimized.

According to certain embodiments, since hashing is used, a number of times that an address of a semiconductor device is accessed may be profiled using a simpler circuit. Thus, the size and manufacturing costs of a profiling circuit for profiling a number of access times may be reduced.

For example, when the number of bits of each of addresses is i, $2^i$ counters are generally needed to profile numbers of times that the addresses are accessed by counting all numbers of times that the addresses are accessed. Here, T denotes a natural number.

In contrast, if it is assumed that N=4, i.e., the number of the storage units 221-1 to 221-N is four and the storage units 221-1 to 221-N are each capable of storing sixteen addresses (see FIG. 5), only 4×16 (=64) counters are needed.

Also, according to certain disclosed embodiments, an address that is more frequently accessed may be effectively controlled.

For example, since addresses adjacent to a concentrated address may be additionally refreshed, the stability and reliability of a semiconductor device may be improved.

Also, according to certain embodiments, hashing is used and a number of times that an address is accessed may be thus profiled through a simpler operation, thereby reducing an operating time of a profiling circuit for profiling a number of access times.

For example, in order to detect or profile a number of times that an input address is accessed without using hashing, searching should be performed ($2^i$-1) times in a worst case scenario.

In contrast, referring to FIG. 5, the comparator 230 may receive the first to $N^{th}$ storing addresses A1 to AN from the at least one storage unit 220, detect a number of times that the input address A_IN is accessed by performing a comparison operation N times, and then update the number of times that the input address A_IN is accessed.

Figure 13:
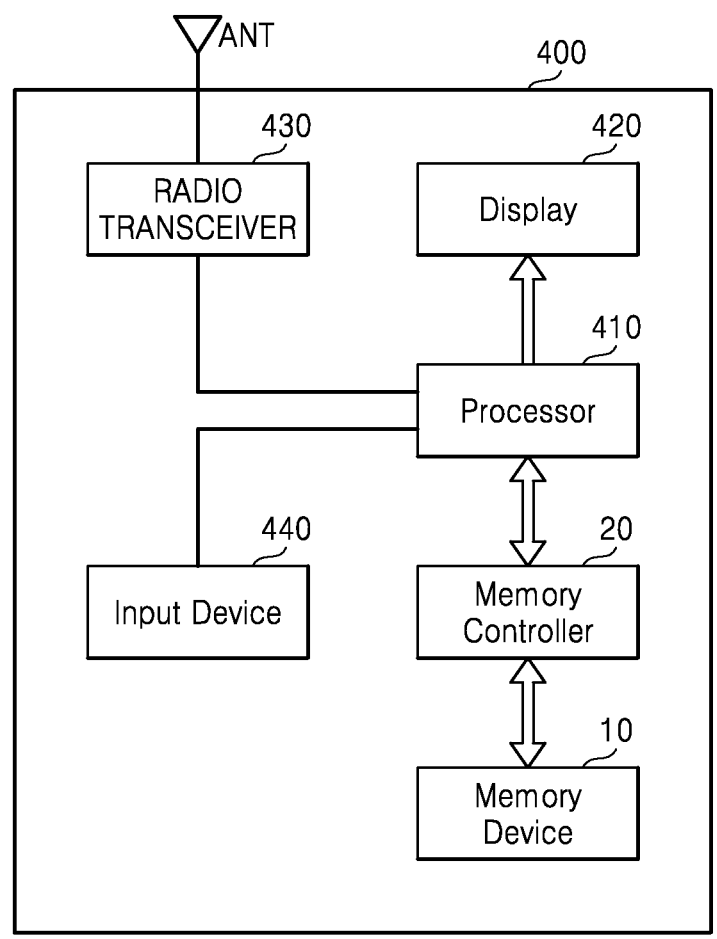
FIG. 13 is a block diagram of a memory system according to some exemplary embodiments.

FIG. 13 is a block diagram of a memory system 400 according to some embodiments. Referring to FIG. 13, the memory system 400 may be implemented, for example, as a cellular phone, a smart phone, a tablet personal computer (PC), a personal digital assistant (PDA) or a radio communication system.

The memory system 400 includes the memory device 10 and the memory controller 20 illustrated in FIG. 2 or FIG. 3. The memory controller 20 may control the data access operations, according to the control of a processor 410.

The page data programmed in the memory device 10 may be displayed through a display 420 according to the control of the processor 410 and/or the memory controller 20.

A radio transceiver 430 transmits or receives radio signals through an antenna ANT. The radio transceiver 430 may convert radio signals received through the antenna ANT into signals that can be processed by the processor 410. Accordingly, the processor 410 may process the signals output from the radio transceiver 430 and transmit the processed signals to the memory controller 20 or the display 420. The memory controller 20 may program the signals processed by the processor 410 to the non-volatile memory device 10. The radio transceiver 430 may also convert signals output from the processor 410 into radio signals and output the radio signals to an external device through the antenna ANT.

An input device 440 enables control signals for controlling the operation of the processor 410 or data to be processed by the processor 410 to be input to the memory system 400. The input device 440 may be implemented by a pointing device such as a touch pad or a computer mouse, a keypad, or a keyboard.

The processor 410 may control the operation of the display 420 to display data output from the memory controller 20, data output from the radio transceiver 430, or data output from the input device 440. The memory controller 20, which controls the operations of the memory device 10, may be implemented as a part of the processor 410 or as a separate chip.

Figure 14:
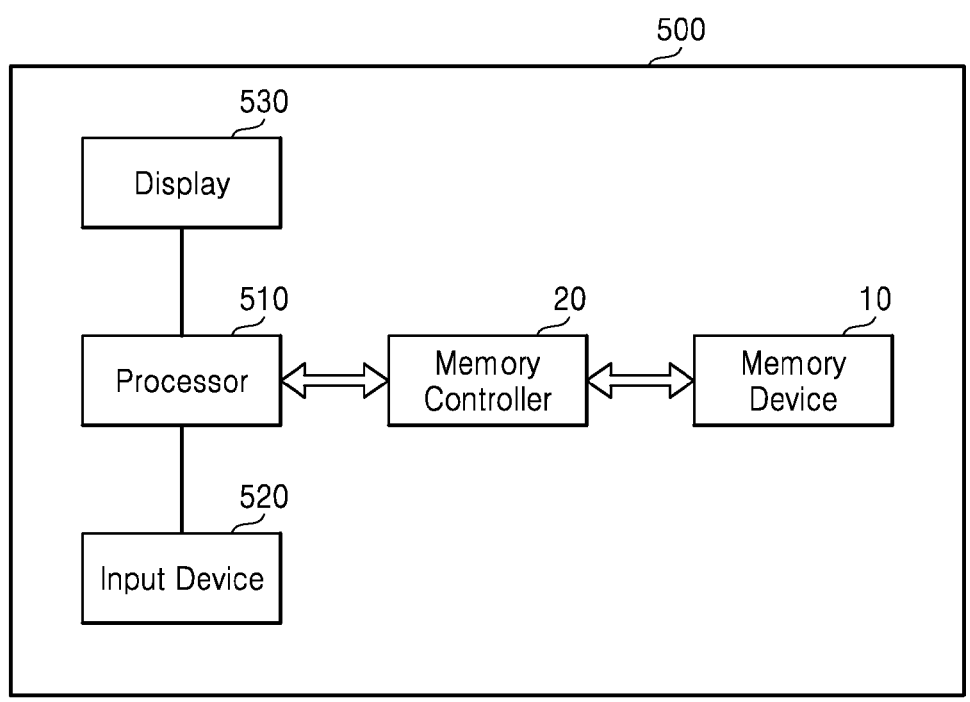
FIG. 14 is a block diagram of a memory system according to other exemplary embodiments.

FIG. 14 is a block diagram of a memory system 500 according to other embodiments. The memory system 500 may be implemented, for example, as a personal computer (PC), a tablet PC, a netbook, an e-reader, a personal digital assistant (PDA), a portable multimedia player (PMP), an MP3 player, or an MP4 player.

The memory system 500 includes the memory device 10 and the memory controller 20 illustrated in FIG. 2 or FIG. 3.

A processor 510 may display data stored in the memory device 10 through a display 530 according to data input through an input device 520. The input device 520 may be implemented by a pointing device such as a touch pad or a computer mouse, a keypad, or a keyboard.

The processor 510 may control the overall operation of the memory system 500 and the operations of the memory controller 20. The memory controller 20, which may control the operations of the memory device 10, may be implemented as a part of the processor 510 or as a separate chip.

Figure 15:
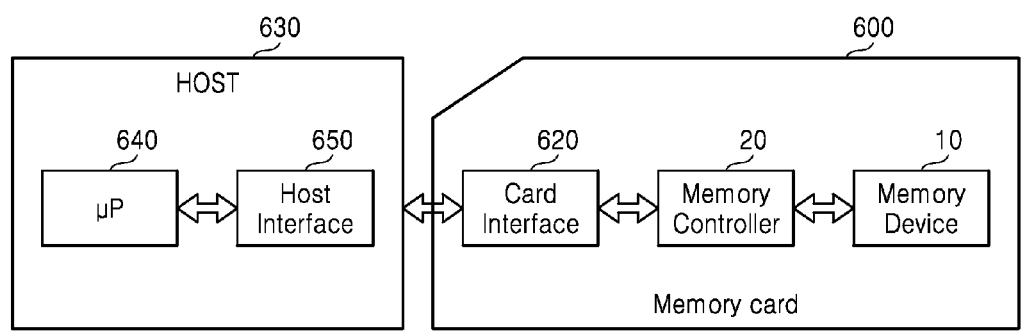
FIG. 15 is a block diagram of a memory system according to further exemplary embodiments.

FIG. 15 is a block diagram of a memory system 600 according to further embodiments. The memory system 600 may be implemented as a memory card or a smart card. The memory system 600 includes the memory device 10 and the memory controller 20 illustrated in FIG. 2 or FIG. 3. The memory system 600 may also include a card interface 620.

The memory controller 20 may control data exchange between the memory device 10 and the card interface 620. The card interface 620 may be, for example, a secure digital (SD) card interface or a multi-media card (MMC) interface, but the inventive concept is not restricted to the current embodiments.

The card interface 620 may interface a host 630 and the memory controller 20 for data exchange according to a protocol of the host 630. The card interface 620 may support a universal serial bus (USB) protocol and an interchip (IC)-USB protocol. Here, the card interface 620 may indicate a hardware supporting a protocol used by the host 630, a software installed in the hardware, or a signal transmission mode.

When the memory system 600 is connected with the host 630 such as a PC, a tablet PC, a digital camera, a digital audio player, a cellular phone, a console video game hardware, or a digital set-top box, a host interface 650 may perform data communication with the memory device 10 through the card interface 620 and the memory controller 20 according to the control of a microprocessor 640.

Figure 16:
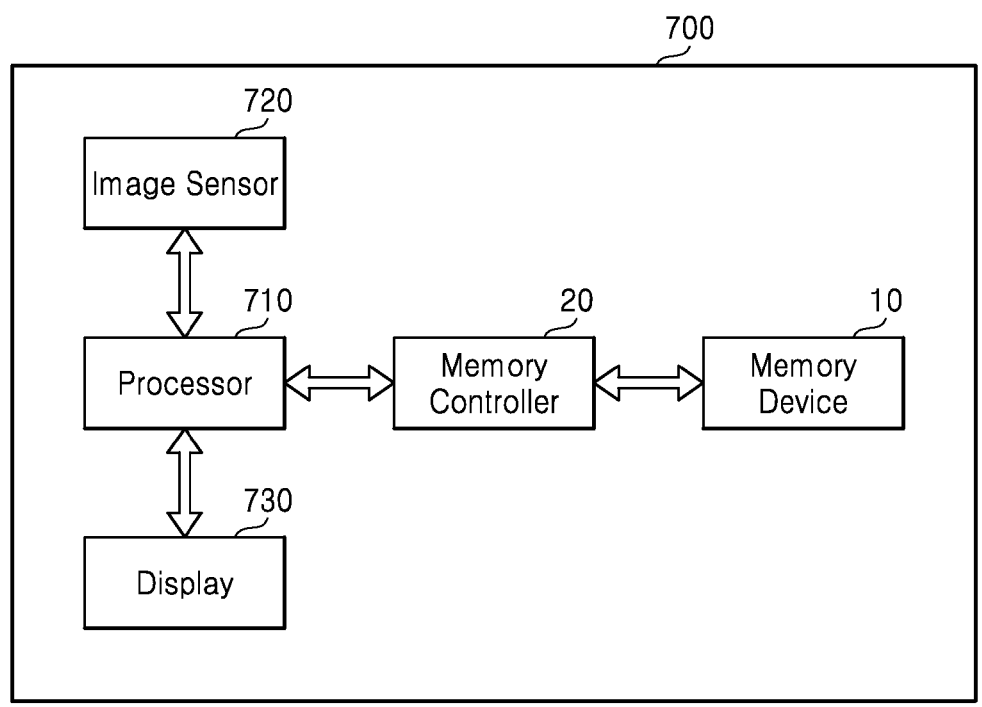
FIG. 16 is a block diagram of a memory system according to other exemplary embodiments.

FIG. 16 is a block diagram of a memory system 700 according to other embodiments. Referring to FIG. 16, the memory system 700 may be implemented as an image processor like a digital camera, a cellular phone equipped with a digital camera, a smart phone equipped with a digital camera, or a tablet PC equipped with a digital camera.

The memory system 700 includes the memory device 10 and the memory controller 20 illustrated in FIG. 2 or FIG. 3.

An image sensor 720 included in the memory system 700 converts optical images into digital signals and outputs the digital signals to a processor 710 or the memory controller 20. The digital signals may be controlled by the processor 710 to be displayed through a display 730 or stored in the memory device 10 through the memory controller 740.

Data stored in the memory device 10 may be displayed through the display 730 according to the control of the processor 710 or the memory controller 20. The memory controller 20, which may control the operations of the memory device 10, may be implemented as a part of the processor 710 or as a separate chip.

Figure 17:
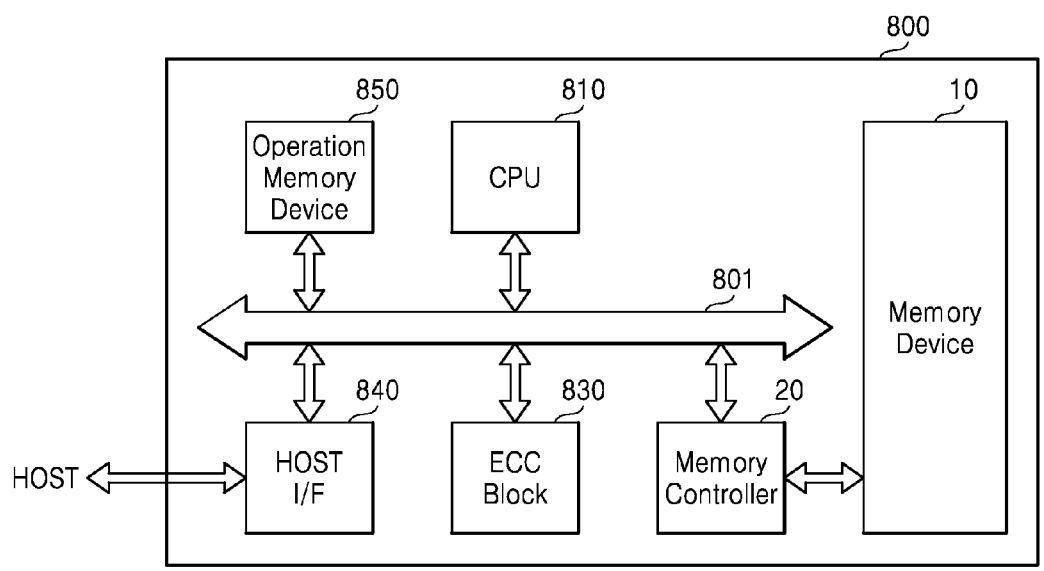
FIG. 17 is a block diagram of a memory system according to yet other exemplary embodiments.

FIG. 17 is a block diagram of a memory system 800 according to yet other embodiments. Referring to FIG. 17, the memory system 900 includes the memory device 10 and the memory controller 20 illustrated in FIG. 2 or FIG. 3.

The memory system 800 may be implemented, for example, as a flash memory drive, a USB memory drive, an IC-USB memory drive, or a memory stick.

The memory system 800 may also include a central processing unit (CPU) 810 controlling operations of the memory device 10, and an operation memory device 850 that may be used as an operation memory of the CPU 810. The operation memory device 850 may be implemented by a non-volatile memory like read-only memory (ROM) or a volatile memory like static random access memory (SRAM). A host connected with the memory system 800 may perform data communication with the memory device 10 through a memory interface 820 and a host interface 840.

An error correction code (ECC) block 830 is controlled by the CPU 810 to detect an error bit included in data output from the memory device 10 through the memory interface 820, correct the error bit, and transmit the error-corrected data to the host through the host interface 840. The CPU 810 may control data communication among the memory interface 820, the ECC block 830, the host interface 840, and the operation memory device 850 through a bus 801.

Figure 18:
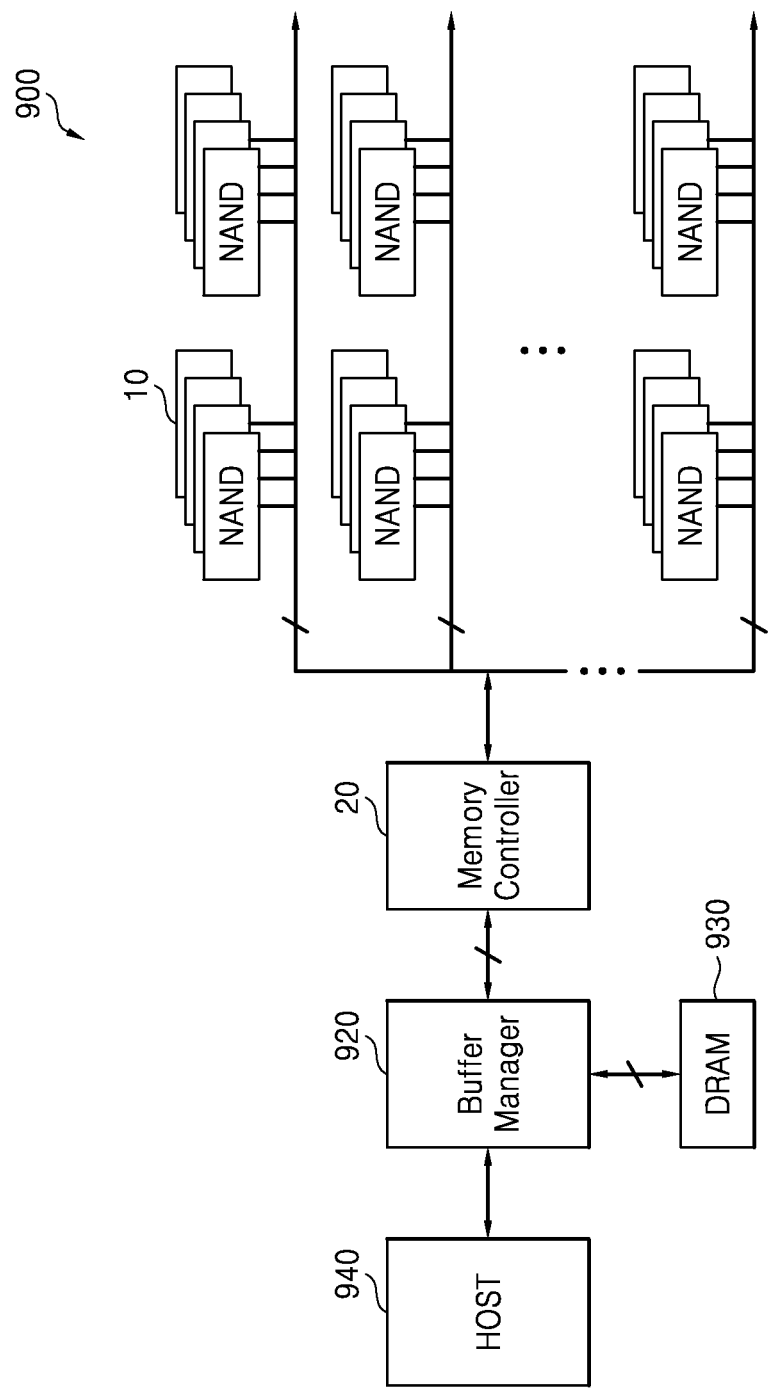
FIG. 18 is a block diagram of a memory system according to still other exemplary embodiments.

FIG. 18 is a block diagram of a memory system 900 according to still other embodiments. The memory system 900 may be implemented as a data storage system like a solid state drive (SSD).

The memory system 900 includes the memory device 10 and the memory controller 20 illustrated in FIG. 2 or FIG. 3. A plurality of memory devices 10 may be provided.

The memory system 900 may further include a volatile memory device 930 like a dynamic random access memory (DRAM), and a buffer manager 920 controlling data transferred between the memory controller 20 and a host 940 to be stored in the volatile memory device 930.

Figure 19:
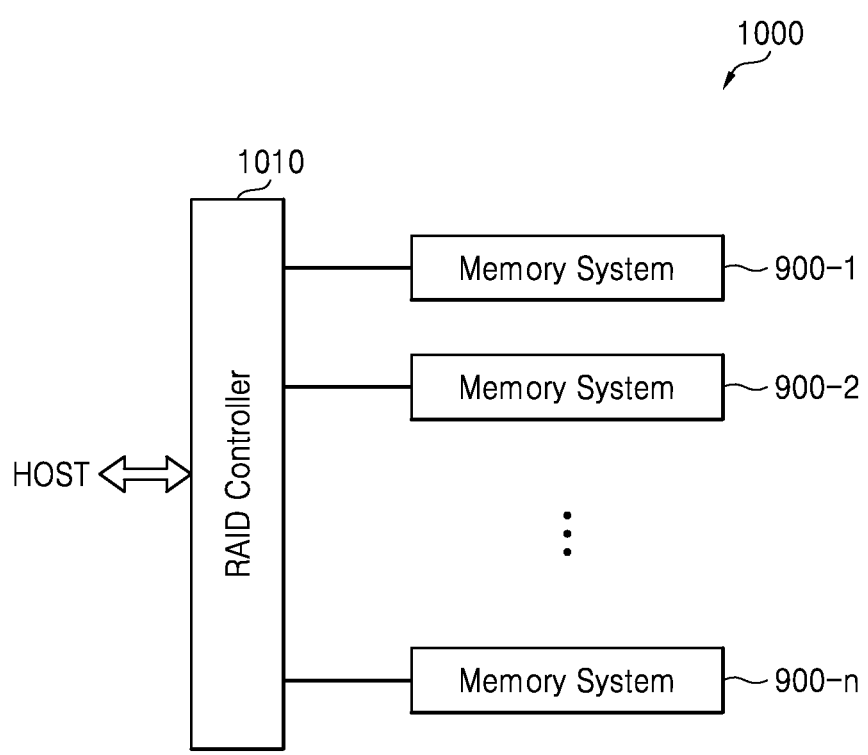
FIG. 19 is a block diagram of a data processor including the memory system illustrated in FIG. 18, according to one exemplary embodiment.

FIG. 19 is an exemplary block diagram of a data processor 1000 including the memory system 900 illustrated in FIG. 18. Referring to FIGS. 18 and 19, the data processor 1000 may be implemented as a redundant array of independent disks (RAID) system. The data processor 1000 includes a RAID controller 1010 and a plurality of memory systems 900-1 through 900-n where "n" is a natural number.

Each of the memory systems 900-1 through 900-n may be the memory system 900 illustrated in FIG. 19. The memory systems 900-1 through 600-n may form a RAID array. The data processor 1000 may be a PC or an SSD.

During a program operation, the RAID controller 1010 may transmit program data output from a host to at least one of the memory systems 900-1 through 900-n according to a RAID level in response to a program command received from the host. During a read operation, the RAID controller 1010 may transmit to the host data read from at least one of the memory systems 900-1 through 900-n in response to a read command received from the host.

Figure 20:
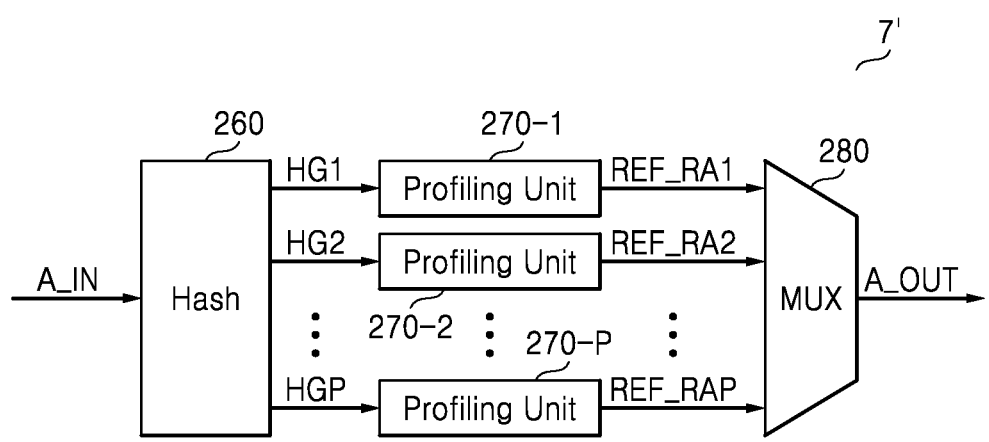
FIG. 20 is a detailed block diagram of a profiling circuit such as that shown in FIG. 1 according to one exemplary embodiment.

FIG. 20 is a detailed block diagram of a profiling circuit 7' such as that shown in FIG. 1 according to one exemplary embodiment.

Referring to FIGS. 5 and 20, the profiling circuit 7' may include a hash unit 260, a plurality of profiling units 270-1 to 270-P, and a multiplexer 280. Here, 'P' denotes an integer that is equal to or greater than '2'. The hash unit 260 may perform a hash operation on an input address A_IN to produce P hash values HG1 to HGP, classify the hash values HG1 to HGP, and output the hash values HG1 to HGP to the profiling units 270-1 to 270-P. respectively.

The hash values HG1 to HGP may be values each having a smaller number of bits than the number of bits of the input address A_IN. In one embodiment, the hash values HG1 to HGP may be Q-bit values. Here, 'Q' denotes an integer that is equal to or greater than '1'. In another embodiment, the numbers of bits of the respective hash values HG1 to HGP may be different from one another.

Each of the hash values HG1 to HGP that the hash unit 260 produces may belong to one of P groups. The hash unit 260 may output the hash value HG1 belonging to a first group to the first profiling unit 270-1, the hash value HG2 belonging to a second group to the second profiling unit 270-2, and the hash value HGP belonging to a $P^{th}$ group to the $P^{th}$ profiling unit 270-P.

Although not shown in FIG. 20, the first to $P^{th}$ profiling units 270-1 to 270-P may each receive an input address A_IN. The first to $P^{th}$ profiling units 270-1 to 270-P may profile a number of times that the input address A_IN is accessed based on the hash values HG1 to HGP, and detect at least one reference address, e.g., reference values REF_RA1 to REF_RAP, based on a profiling result, and output detecting results to the multiplexer 280, respectively.

In one embodiment, each of the first to $P^{th}$ profiling units 270-1 to 270-P may be embodied to have a structure that is the same as or different from the structure of the profiling unit 212 of FIG. 5.

Since the profiling units 270-1 to 270-P are used, a probability that a satisfactory profiling result will be obtained may be higher than when only one profiling unit 212 is used as illustrated in FIG. 5.

The multiplexer 280 may set the reference addresses REF_RA1 to REF_RAP output from the respective first to $P^{th}$ profiling units 270-1 to 270-P to concentrated addresses A_OUT, and sequentially output the concentrated addresses A_OUT.

The present disclosed embodiments can also be embodied as computer-readable codes on a computer-readable medium. The computer-readable recording medium is any tangible data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present disclosed embodiments can be easily construed by programmers.

According to the one or more embodiments, hashing is used and a number of times that an address of a semiconductor device is accessed may be thus profiled using a simpler circuit. Thus, the size and manufacturing costs of a profiling circuit for profiling a number of access times may be reduced. Also, an address that is more frequently accessed may be effectively controlled, thereby improving the stability and reliability of a semiconductor device.

Since hashing is used, the number of times that an address is accessed may be profiled through a simpler operation, an operating time of the profiling circuit for profiling a number of access times may be reduced.

What is claimed is:

1. A method of profiling a number of times that an input/output address of a semiconductor device is accessed, the method comprising:

producing at least one hash value by performing a hash operation on the accessed input/output address; and profiling the number of times that the input/output address of the semiconductor device is accessed, based on the at least one hash value, wherein the profiling of the number of times comprises:

determining whether the input/output address is stored in a storage unit, based on the at least one hash value, increasing a number of access times stored in the storage unit corresponding to the input/output address when it is determined that the input/output address is stored in the storage unit, and reducing a number of times that the input/output address stored in the storage unit corresponding to the at least one hash value has been accessed when it is determined that the input/output address is not stored in the storage unit.

2. The method of claim 1, wherein the profiling of the number of times that the input/output address of the semiconductor device is accessed further comprises:

determining whether the storage unit includes at least one empty entry corresponding to the at least one hash value when it is determined that the input/output address is not stored in the storage unit;

storing the input/output address in one of the at least one empty entry when it is determined that the storage unit includes the at least one empty entry;

storing the input/output address in one of the at least one entry corresponding to the at least one hash value when it is determined that the storage unit does not include the at least one empty entry; and updating the number of access times corresponding to the input/output address.

3. The method of claim 1, wherein the semiconductor device is a dynamic random access memory (DRAM), and the method further comprises:

refreshing a memory cell corresponding to at least one address adjacent to the input/output address when the increased number of access times is equal to or greater than a preset threshold; and initializing the number of access times corresponding to the input/output address.

4. The method of claim 3, wherein the number of access times corresponding to the input/output address is initialized when all of the at least one adjacent address are auto-refreshed within a preset time period.

5. A profiling circuit for profiling a number of times that an input/output address of a semiconductor device is accessed, the profiling circuit comprising:

a hash unit configured to produce a first hash value by performing a first hash operation on the input/output address and a second hash value by performing a second hash operation on the input/output address; and at least one profiling unit configured to profile the number of times that the input/output address is accessed, based on the first hash value and the second hash value, wherein each unit of the at least one profiling unit comprises a plurality of storage units each configured to store at least one address and a number of access times corresponding to the input/output address, based on the first hash value and the second hash value.

6. The profiling circuit of claim 5, wherein each unit of the at least one profiling unit further comprises:

a comparator configured to receive at least one stored address corresponding to the first hash value and the second hash value from the plurality of storage units, and compare the input/output address with the at least one stored address; and a controller configured to update the plurality of storage units, based on a comparison result output from the comparator.

7. The profiling circuit of claim 5, wherein each of the first hash value and the second hash value comprises a smaller number of bits than a number of bits of the input/output address, and wherein each value of the first hash value and the second hash value is produced using different hash functions, respectively.

8. The profiling circuit of claim 7, wherein the hash unit comprises at least one exclusive-OR (XOR) gate or at least one exclusive-NOR (XNOR) gate.

9. A memory device comprising:
an array circuit;
the profiling circuit of claim 5; and
a control circuit configured to control the array circuit based on a result of profiling performed by the profiling circuit.

10. A memory controller for controlling a memory device, the memory controller comprising:
the profiling circuit of claim 5; and
control circuitry configured to output a control signal for controlling the memory device based on a result of profiling performed by the profiling circuit.

11. The profiling circuit of claim 6, wherein the controller is configured to replace a stored address corresponding to a smallest number of access times among the at least one stored address with the input/output address when the input/output address is not equal to any one of the at least one stored address.

12. The profiling circuit of claim 11, wherein the controller is further configured to update a number of access times corresponding to the replaced stored address.

13. The profiling circuit of claim 5, wherein the semiconductor device is a dynamic random access memory (DRAM), and further includes:
a controller configured to receive a refresh address and an auto-refresh signal, and initialize a number of access times corresponding to a storage unit corresponding to the refresh address according to the auto-refresh signal.

14. A method for a semiconductor memory address, comprising:
receiving a first address for accessing a first memory cell of a memory cell array;
performing a first hash function and a second hash function on the received first address;
determining a first hash value based on the first hash function and a second hash value based on the second hash function;
storing the first address at a first location determined based on the first hash value and the second hash value; and
storing a count of the number of access times for the first address.

15. The method of claim 14, wherein the storing the first address at a first location is determined based on the first hash value and the second hash value comprising:
storing the first address at the first location within a first register based on the first hash value and the second hash value; and
storing the count of the number of access times for the first address in the first register.

16. The method of claim 15, further comprising:
receiving the first address for accessing the first memory cell a second time;
performing the first hash function and the second hash function on the second received first address;
determining the first hash value based on the first hash function and the second hash value based on the second hash function; and
based on the first hash value and the second hash value, determining that the first address is already stored at the first location within the first register, and incrementing the count of the number of access times for the first address.

17. The method of claim 16, further comprising:
receiving a second address for accessing a second memory cell of the memory cell array;
performing the first hash function and the second hash function on the received second address;
for the received second address, determining a first hash value based on the first hash function and a second hash value based on the second hash function; and
based on the first hash value and the second hash value of the received second address, determining that the first location in the first register is already occupied with an address different from the second address, and storing the second address at a second location within a second register.

18. The method of claim 14, wherein the first memory cell is included in a first row of the memory cell array, and further comprising:
comparing the count to a predetermined threshold; and
in response to the count exceeding the predetermined threshold, performing a refresh of a neighbor row of the first row.

* * * * *